(12) United States Patent
Ryoo et al.

(10) Patent No.: US 7,214,957 B2
(45) Date of Patent: May 8, 2007

(54) PRAMS HAVING PHASE-CHANGE LAYER PATTERN WITH ELECTRODE CONTACT AREA AND METHODS OF FORMING THE SAME

(75) Inventors: Kyung-Chang Ryoo, Gyeonggi-do (KR); Su-Youn Lee, Gyeonggi-do (KR); Young-Nam Hwang, Gyeonggi-do (KR); Se-Ho Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/217,943

(22) Filed: Sep. 1, 2005

(65) Prior Publication Data

US 2006/0043355 A1 Mar. 2, 2006

(30) Foreign Application Priority Data

Sep. 2, 2004 (KR) ............. 10-2004-0070089

(51) Int. Cl.
*H01L 29/02* (2006.01)
(52) U.S. Cl. ............... 257/2; 257/3; 257/4; 257/5; 257/751; 257/296; 438/253; 438/95; 438/391
(58) Field of Classification Search ............ None
See application file for complete search history.

(56) References Cited

U.S. PATENT DOCUMENTS 6,586,761 B2 7/2003 Lowrey
6,867,425 B2 * 3/2005 Wicker ............. 257/3
2002/0197566 A1 12/2002 Maimon et al.
2003/0071289 A1 4/2003 Hudgens et al.
2003/0201469 A1 10/2003 Lowrey

FOREIGN PATENT DOCUMENTS

KR 10-2004-0054250 6/2004

OTHER PUBLICATIONS

English Translation of Korean Office Action for Korean Patent Application No. 10-2004-0070089 mailed on Apr. 25, 2006.
Korean Office Action for Korean Patent Application No. 10-2004-0070089 mailed on Apr. 25, 2006.

* cited by examiner

*Primary Examiner*—Evan Pert
*Assistant Examiner*—Fazli Erdem
(74) *Attorney, Agent, or Firm*—Myers Bigel Sibley & Sajovec

(57) ABSTRACT

According to some embodiments of the present invention, there are provided PRAMS having a phase-change layer pattern interposed between a molding layer and a forming layer pattern, and methods of forming the same that include a node conductive layer pattern, a molding layer, a forming layer pattern and a protecting layer. The molding layer, the forming layer pattern and the protecting layer are formed to cover the planarized interlayer insulating layer and the node conductive layer pattern. A lower electrode is interposed between the molding layer and the planarized interlayer insulating layer. A phase-change layer pattern is formed on the planarized interlayer insulating layer. A spacer pattern is disposed between the phase-change layer pattern and the molding layer.

13 Claims, 12 Drawing Sheets

PRAMS HAVING PHASE-CHANGE LAYER PATTERN WITH ELECTRODE CONTACT AREA AND METHODS OF FORMING THE SAME

REFERENCE TO PRIORITY APPLICATION

This application claims priority to Korean Application Serial No. 2004-70089, filed Sep. 02, 2004, the disclosure of which is hereby incorporated herein by reference.

FIELD OF THE INVENTION

The present invention relates to non-volatile memory devices and methods of forming the same, and more specifically, to PRAM Phase-changeable random-access memory devices and methods of forming the same.

BACKGROUND OF THE INVENTION

Generally, a PRAM (Phase-changeable memory device) has a transistor and a phase-change layer pattern. A PRAM may have one or more contacts to electrically connect the phase-change layer pattern and the transistor. One contact may connect to a source or drain region of the transistor, and the remaining contacts may connect and overlap the phase-change layer pattern.

Storing data in a PRAM typically requires high current density. When heavy current flows through the transistor and the contacts to the phase-change layer, the phase of the crystal structure of the phase-change layer pattern changes. The PRAM cell then stores either a "0" or "1" when this phase-change occurs.

Unfortunately, high current can lead to unwanted high power consumption. Increasing the contact resistance between the phase-change layer and the contact is a way to reduce the power consumption. Many methods for reducing area of the contacts have been proposed to increase the resistance and reduce the power consumption. Yet, as PRAMs become smaller, forming small contacts to the phase-change layer pattern generally becomes increasingly difficult. This difficulty arises because the reduction of design rules limit photolithography processes for defining contact images on photoresist layers. Furthermore, the limited photolithography process may decrease the flexibility of the PRAM fabrication processes.

In disclosing a method of making a programmable resistance memory element with a small contact area, U.S. Pat. Publication No. 2002/0197566 to Jon Maimom, et. al ('197566) presents one solution for increasing contact resistance. This solution is to use a silylation process to form small contact areas.

According to '197566, the method includes providing a first material layer, which may be formed using a conductive layer. A second material layer, a photoresist layer, is formed on the first material layer. The second material layer is partially removed, thereby forming a pattern on the first material layer. A silylation agent is deposited on the sidewalls and the upper surface of this photoresist pattern. Silicon atoms diffuse from the photoresist layer into the silylation agent forming the silylation layer.

The method further involves forming a third material layer, which is a photoresist layer, on the first material layer and the silylation layer. The third material layer is partially removed, thereby exposing the silylation layer between the second material layer and the third material layer. The silylation layer is removed. Using the third material layer and the second material layer as an etch mask, the first material layer is partially removed, thereby forming a narrow opening in the first material layer. A programmable resistance material is deposited in the narrow opening and contacts a lower electrode on a layer below the first layer. Thus, because the layer of programmable resistance is so narrow, the contact area between the programmable resistance material and the lower electrode is small. By decreasing the contact area with the silylation process, the contact resistance is increased and power consumption is reduced.

However, the '197566 solution can be expensive and increase fabrication time. Since the '197566 method includes a silylation process, two additional photolithography processes, and one additional etch for the formation of the opening, the method may increase production costs for a semiconductor device. Furthermore, the method may prolong fabrication time because the second and third material layers and the silylation layer typically are removed on different working lines of the processes.

SUMMARY OF THE INVENTION

In some embodiments of the present invention, an integrated circuit device includes an interlayer insulating layer on a substrate, a first electrode in the interlayer insulating layer, a second electrode on or in the interlayer insulating layer and laterally displaced from the first electrode, and a phase-change material layer pattern on the substrate. The phase-change material layer has a first portion in contact with the interlayer insulating layer and the first electrode, and it also has a second portion that extends laterally from the first portion to overlie and contact the second electrode. The second portion may extend from the first portion towards the second electrode along a first axis, and the first portion may have a greater width transverse to the first axis than the second portion. The first portion of the phase-change material layer and the second electrode lie on the interlayer insulating layer, and the second portion may step up from the first portion to overlap the second electrode.

In some additional embodiments of the present invention, the phase change layer may conform to surfaces of a mold disposed on the interlayer insulating layer. When the phase-change layer conforms to surfaces of a mold disposed on the interlayer insulating layer, the mold may include: a molding layer disposed on the interlayer insulating layer that has an opening, a sidewall spacer disposed on a sidewall of the molding layer and on the second electrode, and the second portion of the phase-change material layer pattern may extend between the first portion of the phase-change material layer pattern and the sidewall spacer. A portion of the phase-change material layer on the second electrode may abut the sidewall spacer. Also, a connection node may extend through the molding layer to contact the second electrode.

Some method embodiments of the present invention include forming an interlayer insulating layer on a substrate, forming a first electrode in the interlayer insulating layer, forming a second electrode on or in the interlayer insulating layer and laterally displaced from the first electrode, and forming a phase-change material layer pattern on the substrate. The phase-change material layer may have a first portion in contact with the interlayer insulating layer and the first electrode and a second portion that extends laterally from the first portion to overlie and contact the second electrode. The second portion may extend from the first portion towards the second electrode along a first axis, and the first portion may have a greater width transverse to the first axis than the second portion.

In some additional method embodiments of the present invention, forming the phase-change layer may further include forming a mold on the interlayer insulating layer and forming the phase-change material layer pattern in the mold. Forming the mold may include forming a molding layer that has an opening on the interlayer insulating layer, forming a sidewall spacer on a sidewall of the molding layer and on the second electrode, and the second portion of the phase-change material layer pattern may extend between the first portion of the phase-change material layer pattern and the sidewall spacer. The method may further include forming the first portion of the phase-change material layer and the second electrode to lie on the interlayer insulating layer and forming the second portion to step up from the first portion to overlap the second electrode. The method may further include forming a portion of the phase-change material layer on the second electrode to abut the sidewall spacer. The method may also include controlling the thickness of the sidewall spacer to control the overlap of the second portion of the phase-change material layer on the second electrode. The method may further include forming a connection node extending through the molding layer to contact the second electrode.

DETAILED DESCRIPTION OF THE INVENTION

Figure 1:
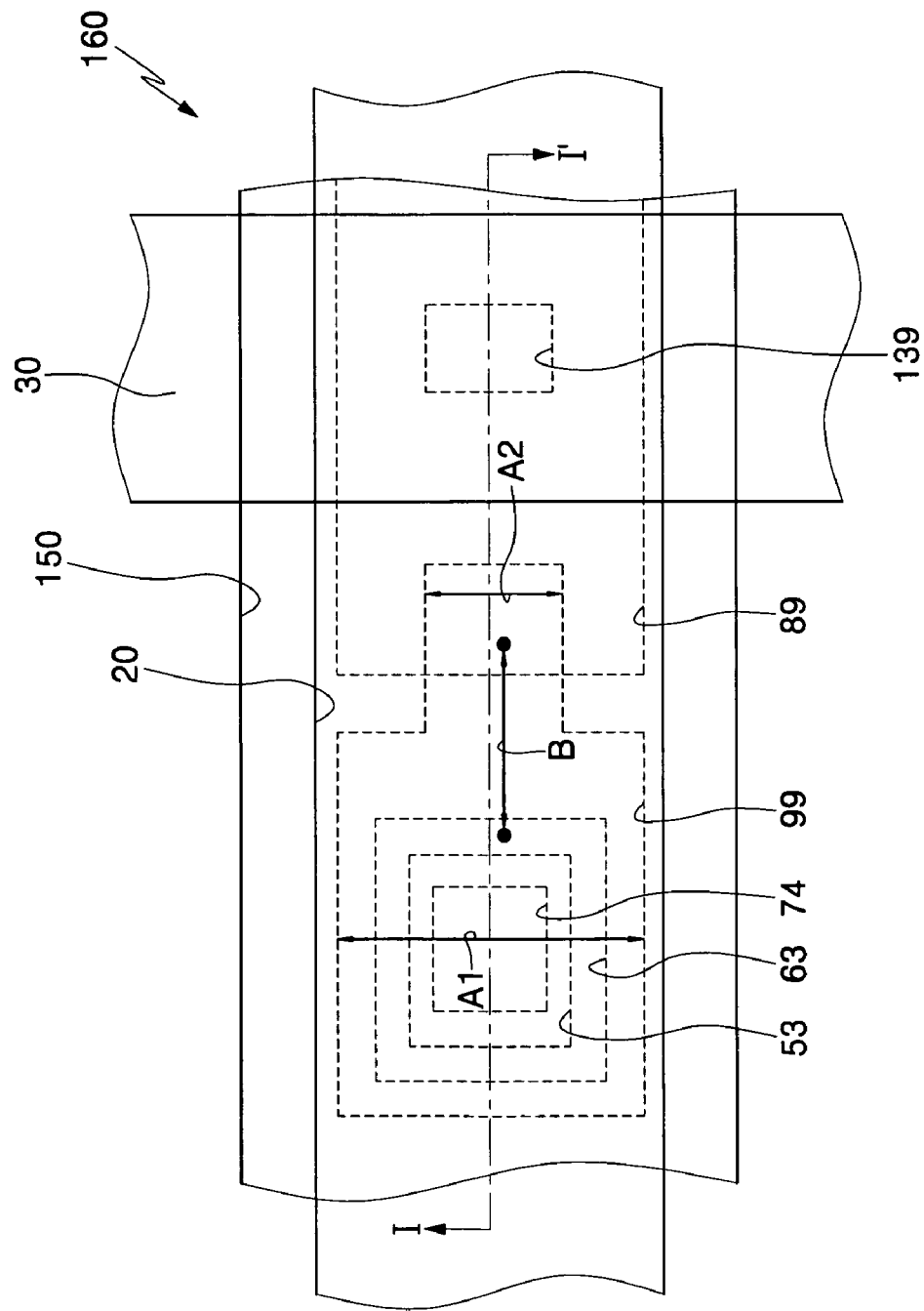
FIG. 1 is a layout view of a PRAM according to some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
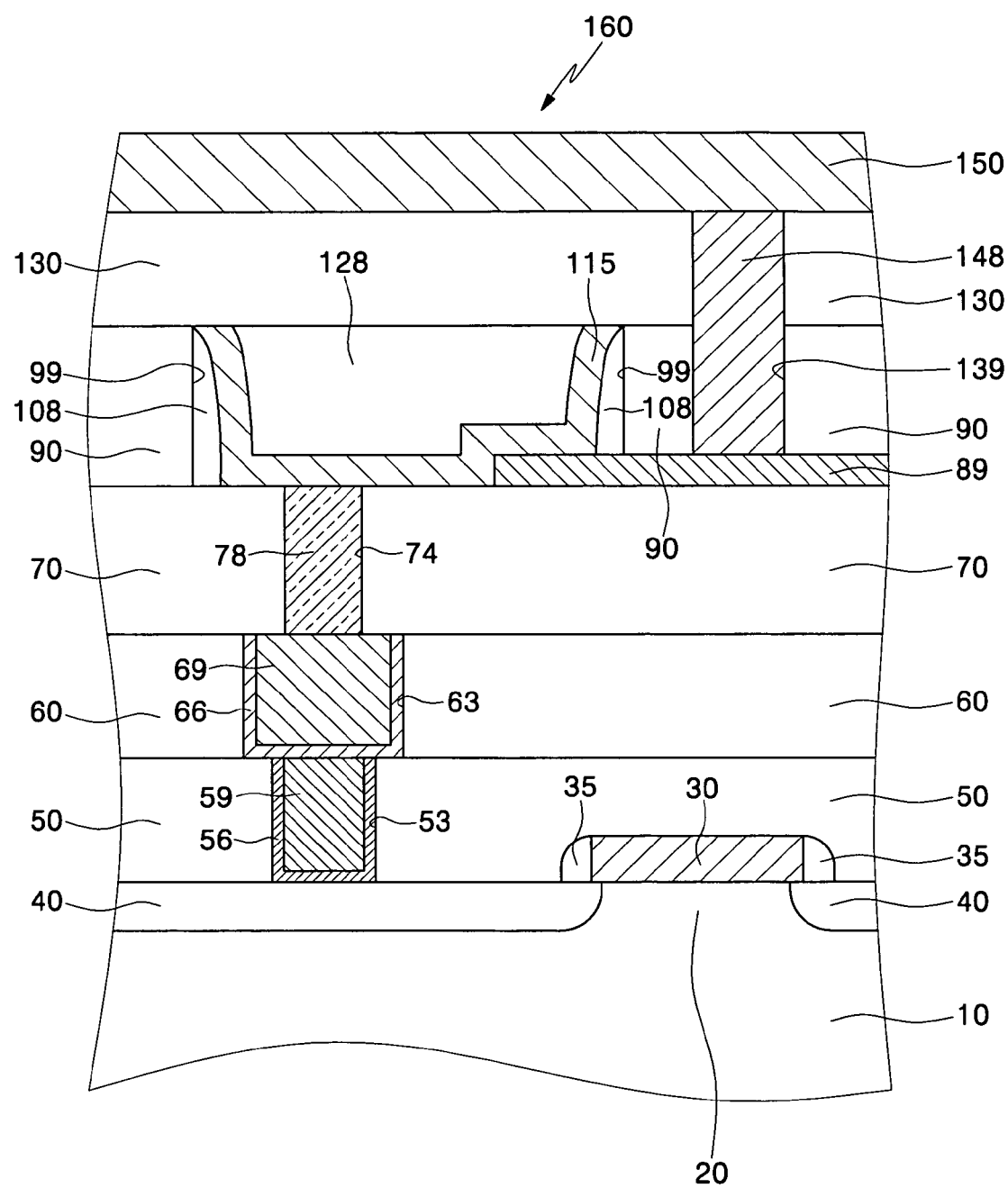
FIG. 2 is a cross sectional view of FIG. 1 taken along line I–I' of FIG. 1.

FIG. 1 is a layout view of a PRAM according to some embodiments of the present invention, and FIG. 2 is a cross sectional view showing the PRAM of FIG. 1 taken along line I–I' of FIG. 1.

Referring to FIGS. 1 and 2, a PRAM (Phase-changeable memory devices) 160 includes a node conductive layer pattern 78, which is disposed in a planarized interlayer insulating layer 70 on an active region 20 of a semiconductor substrate 10. The node conductive layer pattern 78 fills a node contact hole 74, which is disposed in the planarized interlayer insulating layer 70. The node conductive layer pattern 78 may be a titanium nitride (TiN) layer. The planarized interlayer insulating layer 70 may be a silicon oxide ($SiO_2$) layer. The semiconductor substrate 10 may have p-type impurity ions.

A molding layer 90, a forming layer pattern 128, and a protecting layer 130 are formed to cover the planarized interlayer insulating layer 70 and the node conductive layer pattern 78. The protecting layer 130 may be an insulating layer having the same etching ratio as that of the planarized interlayer insulating layer 70. The molding layer 90 has a pattern hole 99 therein. The forming layer pattern 128 is formed to be surrounded by a molding layer 90 through the pattern hole 99. The molding layer 90 and the forming layer pattern 128 may have upper surfaces at substantially the same level. Alternatively, the molding layer 90 and the forming layer pattern 128 may have upper surfaces at different levels. The molding layer 90 may be an insulating layer having the same etching ratio as that of the protecting layer 130. The forming layer pattern 128 may be an insulating layer having the same etching ratio as that of the molding layer 90. The forming layer pattern 128 may be an insulating layer having an etching ratio different from that of the molding layer 90. A lower electrode 89 is interposed between the molding layer 90 and the planarized interlayer insulating layer 70. An upper electrode 150 is disposed on the protecting layer 130. The upper and lower electrodes 150, 89 may include titanium nitride layer, titanium aluminum nitride (TiAlN) layer, tantalum nitride (TaN) layer and/or titanium tungsten (TiW) layer. As shown in FIG. 1, a width A1 of the pattern hole 99 at the node contact hole 74 may be greater than a width A2 at the lower electrode 89.

A phase-change layer pattern 115 is disposed on the planarized interlayer insulating layer 70, interposed between the molding layer 90 and the forming layer pattern 128. The phase-change layer pattern 115 contacts the lower electrode 89 and the node conductive layer pattern 78. The phase-change layer pattern 115 may have a curved surface contacting the upper surface of the node conductive layer pattern 78. Further, the top surfaces of the phase-change layer pattern 115 on the node conductive layer pattern 78 and the lower electrode 89 may have different widths in a direction perpendicular to the plane of FIG. 2 (i.e. perpendicular to the line I–I' at FIG. 1). The phase-change layer pattern 115 may be a chalcogenide material including, for example, a compound ($Ge_xSb_yTe_z$) of germanium, antimony and tellurium.

The spacer pattern 108 is disposed between the phase-change layer pattern 115 and the molding layer 90. The spacer pattern 108, the phase-change layer pattern 115 and the forming layer pattern 128 fill the pattern hole 99. The spacer pattern 108 may be an insulating layer having the same etching ratio as that of the molding layer 90. The spacer pattern 108 may be an insulating layer having an etching ratio different from that of the molding layer 90. A connection node layer pattern 148 is disposed in the protecting layer 130 and the molding layer 90 and disposed on the lower electrode 89. The connection node layer pattern 148 fills a connection hole 139, which is disposed in the molding layer 90 and the protecting layer 130. The connection node layer pattern 148 connects the lower electrode 89 and an upper electrode 150. The connection node layer pattern 148 may be a titanium nitride layer. The extension lines passing the connection node layer pattern 148 and the node conductive layer pattern 78 respectively are normal to the upper surface of the semiconductor substrate 100 and spaced from each other with a predetermined distance. The lower electrode 89 extends from the connection node layer pattern 148 toward the node conductive layer pattern 78 and is disposed below a portion of the forming layer pattern 128. The sidewalls of the phase-change layer pattern 115 may be disposed substantially parallel to the sidewalls of the connection node layer pattern 148.

A pad interlayer insulating layer 50 and a buried interlayer insulating layer 60 are stacked between the semiconductor substrate 10 and the planarized interlayer insulating layer 70. The buried interlayer insulating layer 60 may be an insulating layer having the same etching ratio as that of the planarized interlayer insulating layer 70. The buried and pad interlayer insulating layers 60, 50 may be insulating layers having a same etching ratio.

A buried conductive layer pattern 69 is disposed in the buried interlayer insulating layer 60. The buried conductive layer pattern 69 may be a tungsten (W) layer. The buried conductive layer pattern 69 contacts the node conductive layer pattern 78. The buried conductive layer pattern 69 fills a buried contact hole 63 in the buried interlayer insulating layer 60. A buried glue layer pattern 66 is disposed between the buried interlayer insulating layer 60 and the buried conductive layer pattern 69 to surround the buried conductive layer pattern 69. The buried glue layer pattern 66 may be a titanium nitride layer. The pad conductive layer pattern 59, which contacts the buried glue layer pattern 66, is disposed in the pad interlayer insulating layer 50. The pad conductive layer pattern 59 fills a pad contact hole 53 in the pad interlayer insulating layer 50. The pad conductive layer pattern 59 may be a tungsten layer. A pad glue layer pattern 56 is disposed between the pad interlayer insulating layer 50 and the pad conductive layer pattern 59 so as to surround the pad conductive layer pattern 59. The pad glue layer pattern 56 may be a titanium nitride layer.

A gate pattern 30 is disposed on the semiconductor substrate 10 and covered with the pad interlayer insulating layer 50. The gate pattern 30 may include a gate and a gate capping layer pattern, which are stacked. The gate capping layer pattern may be a silicon nitride ($Si_3N_4$) layer. The gate may be an $n^+$-type doped polysilicon layer. The gate pattern may include an $n^+$-type doped polysilicon layer and a tungsten silicide (WSi) layer, which are stacked. Gate spacers 35 are disposed to cover sidewalls of the gate pattern 30. The gate spacer 35 may be an insulating layer having the same etching ratio as that of the gate capping layer pattern. Impurity regions 40 are disposed in the semiconductor substrate 10 and overlap the gate pattern 30. The pad glue layer pattern 56 contacts one of the impurity regions 40. The impurity regions 40 have $n^+$-type impurity ions.

Now, hereinafter, methods of forming PRAMS having a phase-change layer pattern interposed between a molding layer and a forming layer pattern will be described.

FIGS. 3 to 13 are cross sectional views illustrating operations for forming a PRAM taken along line I–I' of FIG. 1, respectively.

Figure 3:
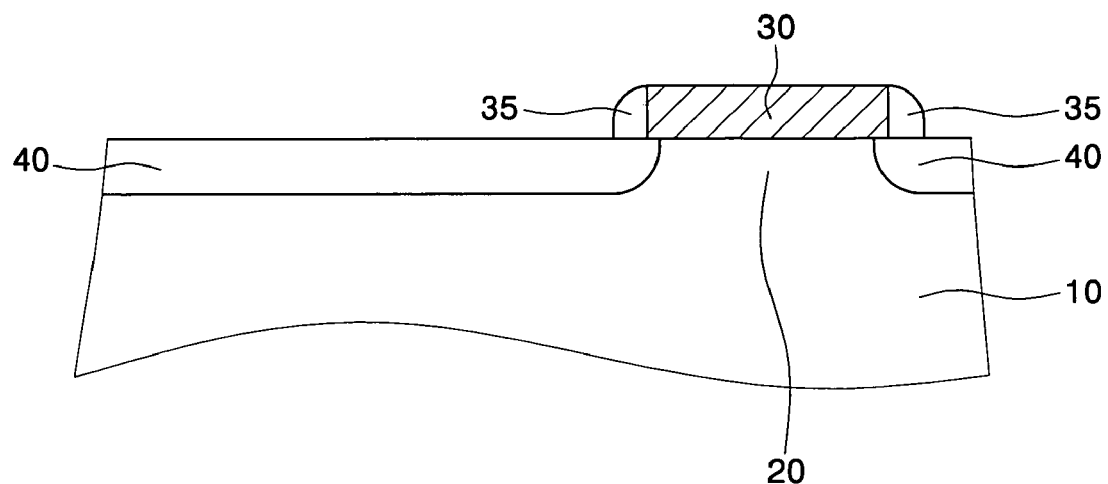
FIGS. 3 to 13 are cross sectional views taken along line I–I' of FIG. 1 illustrating exemplary operations for forming a PRAM according to some embodiments of the present invention.
Figure 4:
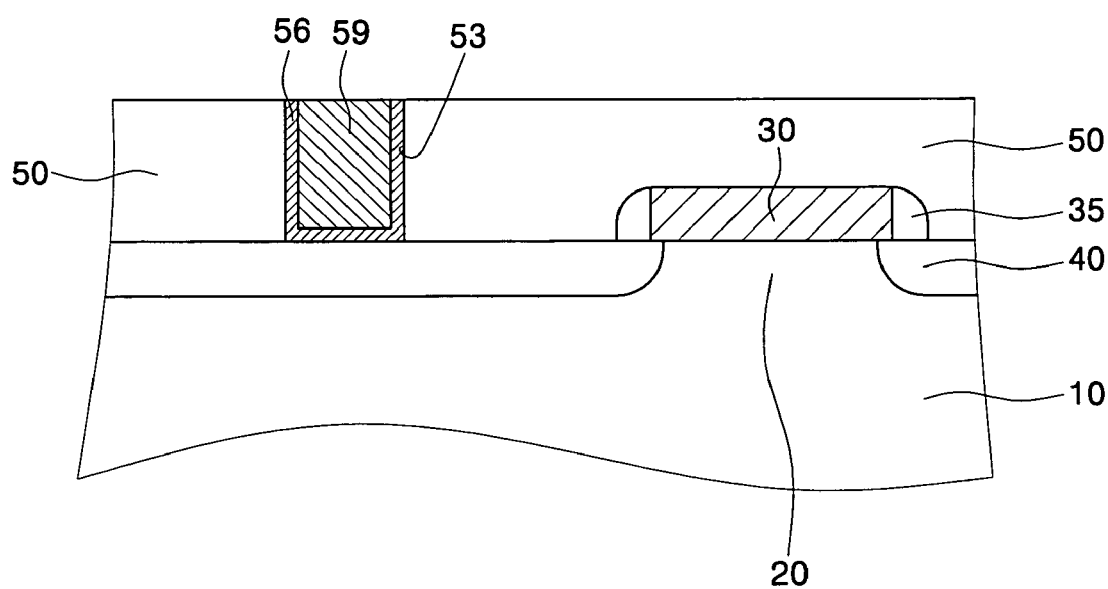

Referring to FIGS. 1, 3 and 4, a gate pattern 30 is formed on an active region 20 of a semiconductor substrate 10. The gate pattern 30 is formed using a gate and a gate capping layer pattern, which are stacked. The gate capping layer pattern may be formed using a silicon nitride ($Si_3N_4$) layer. The gate may be formed using an $n^+$-type doped polysilicon layer. Alternatively, the gate pattern 30 may include an $n^+$-type doped polysilicon layer and a tungsten silicide (WSi) layer, which are stacked. Gate spacers 35 are formed on sidewalls of the gate pattern 30. The gate spacers 35 are formed from an insulating layer having the same etching ratio as that of the gate capping layer pattern. The semiconductor substrate 10 is formed to have p-type impurity ions.

Impurity regions 40 are formed in the semiconductor substrate 10 to overlap the gate pattern 30. The impurity regions 40 may be formed using $n^+$-type impurity ions. A pad interlayer insulating layer 50 is formed on the semiconductor substrate 10 to cover the gate pattern 30. The pad interlayer insulating layer 50 may be formed using an insulating layer having an etching ratio different from that of the gate spacer 35. The pad interlayer insulating layer 50 may be formed using a silicon oxide ($SiO_2$) layer.

A pad contact hole 53 is formed to expose one of the impurity regions 40. A pad glue layer pattern 56 and a pad conductive layer pattern 59 are formed in the pad contact hole 53. The pad conductive layer pattern 59 may be formed using a tungsten (W) layer. The pad glue layer pattern 56 may be formed using a titanium nitride (TiN) layer.

Figure 5:
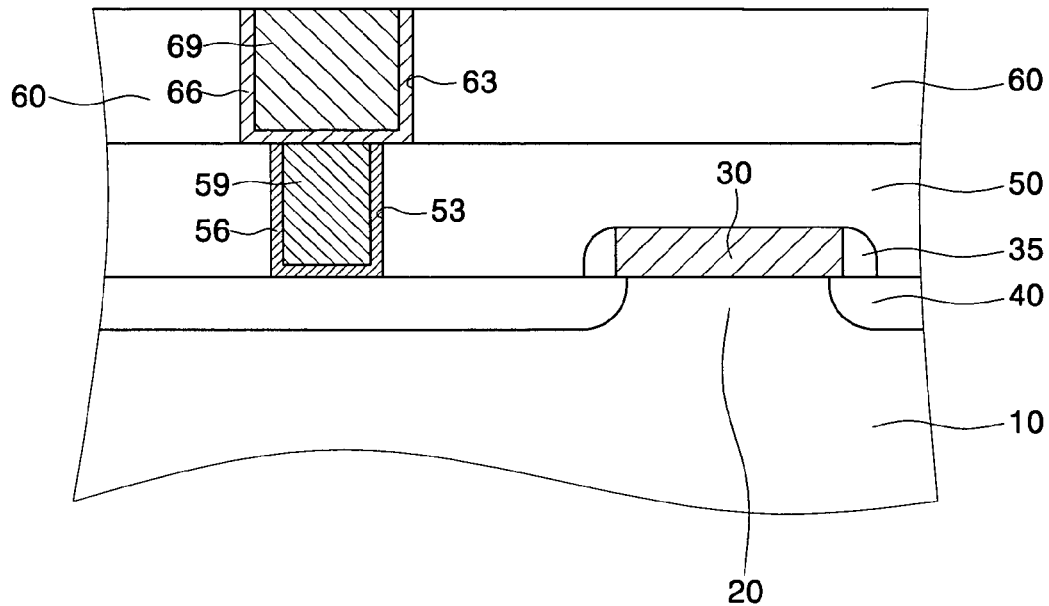
Figure 6:
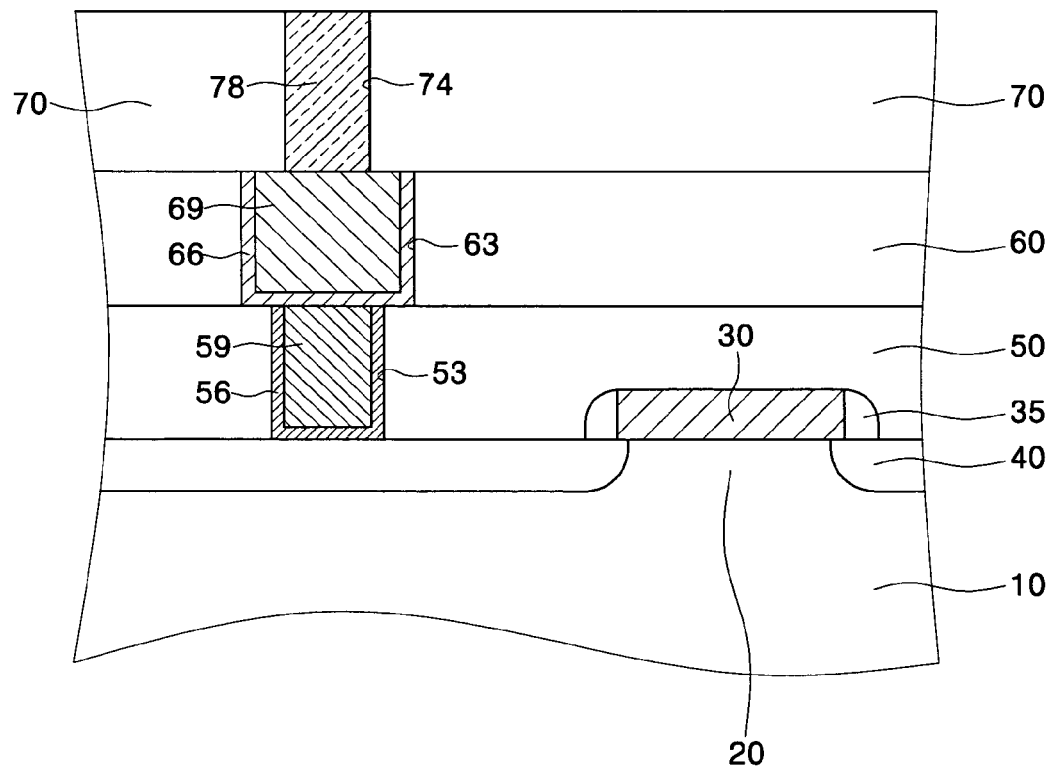

Referring to FIGS. 1, 5 and 6, a buried interlayer insulating layer 60 is formed on the pad interlayer insulating layer 50 to cover the pad glue layer and the pad conductive layer patterns 56, 59. The buried interlayer insulating layer 60 may be formed using an insulating layer having the same etching ratio as that of the pad interlayer insulating layer 50. A buried contact hole 63 is formed on the pad contact hole 53 through the buried interlayer insulating layer 60. The buried contact hole 63 may be formed in the buried interlayer insulating layer 60 to have an extension line passing a center of the pad contact hole 53. Accordingly, the buried contact hole 63 may be formed to expose the pad glue layer and the pad conductive layer patterns 56, 59. A buried glue layer pattern 66 and a buried conductive layer pattern 69 are formed to fill the buried contact hole 63. The buried conductive layer pattern 69 may be formed using a tungsten layer. The buried glue layer pattern 66 may be formed using a titanium nitride layer.

A planarized interlayer insulating layer 70 is formed on the buried interlayer insulating layer 60 to cover the buried glue layer and the buried conductive layer patterns 66, 69. The planarized interlayer insulating layer 70 may be formed using an insulating layer having the same etching ratio as that of the buried interlayer insulating layer 60. A node contact hole 74 is formed on the buried contact hole 63 through the planarized interlayer insulating layer 70. The node contact hole 74 is formed to expose the buried conductive layer pattern 69. The node contact hole 74 may be formed in the planarized interlayer insulating layer 70 to have an extension line passing a center of the buried contact hole 63. A node conductive layer pattern 78 is formed to fill the node contact hole 74. The node conductive layer pattern 78 may be formed using a titanium nitride layer.

Figure 7:
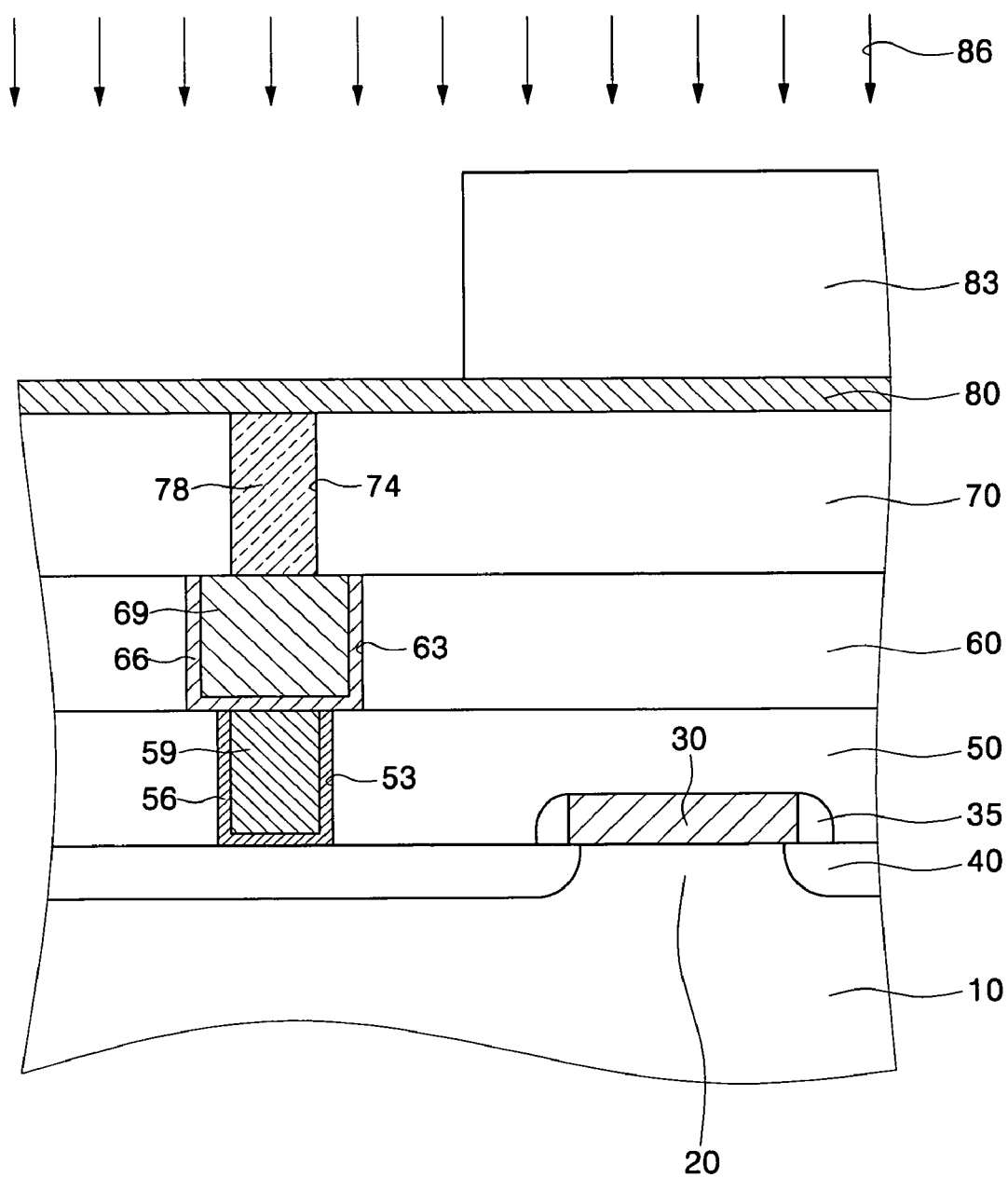
Figure 8:
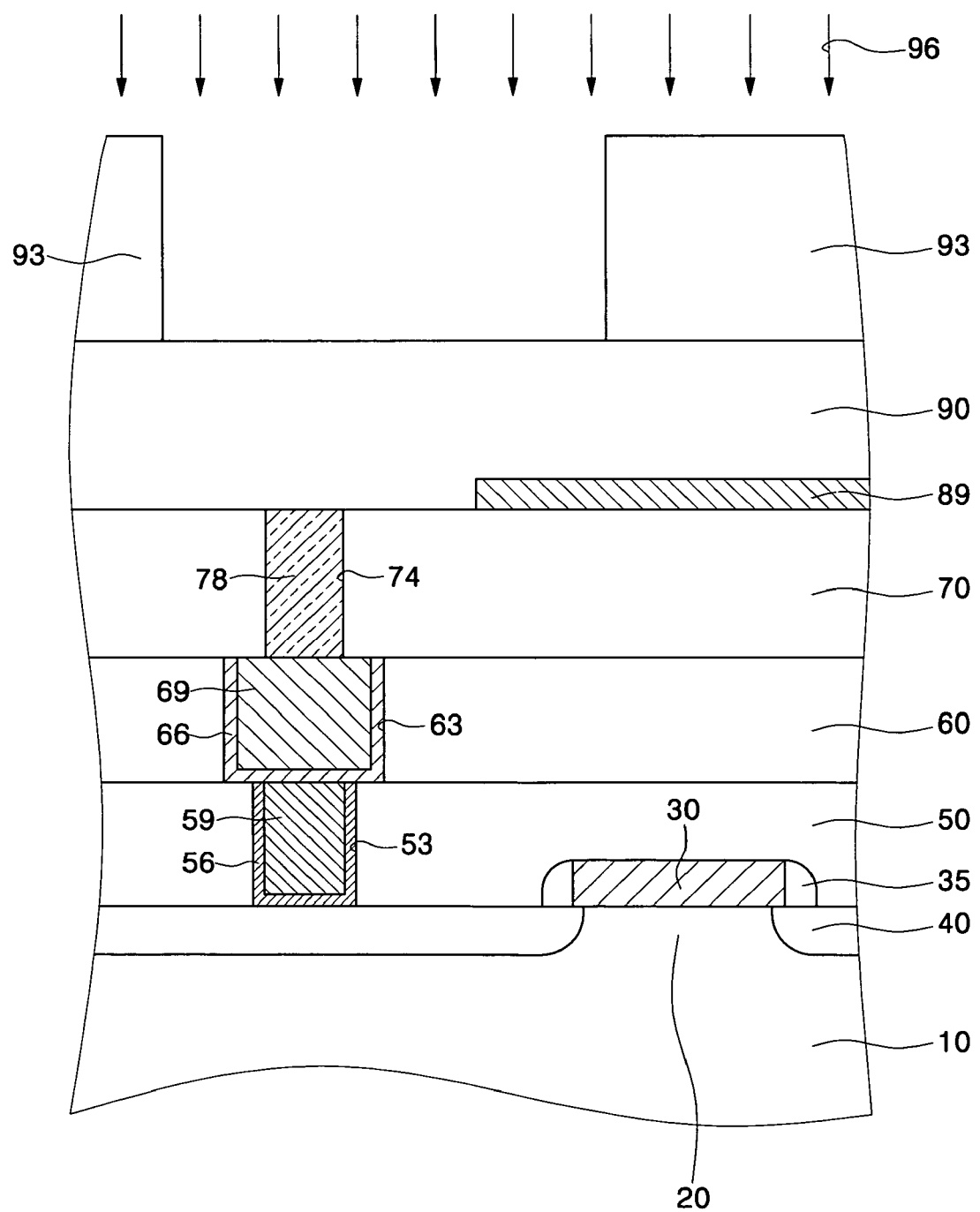

Referring to FIGS. 1, 7 and 8, a lower electrode layer 80 and a photoresist pattern 83 are formed on the planarized interlayer insulating layer 70. The photoresist pattern 83 is formed to cover a predetermined portion of the lower electrode layer 80. In particular, the photoresist pattern 83 is formed to overlap the gate pattern 30 and concurrently, to be spaced from the node conductive layer pattern 78 a predetermined distance. The lower electrode layer 80 may be formed from a titanium nitride layer, a titanium aluminum nitride (TiAlN) layer, a tantalum nitride (TaN) layer and/or a titanium tungsten (TiW) layer. Using the photoresist pattern 83 and the planarized interlayer insulating layer 70 as an etch mask and an etch buffer layer, an etch process 86 is performed on the lower electrode layer 80. After the performance of the etch process 86, the photoresist pattern 83 is removed from the semiconductor substrate 10. The etch process 86 forms a lower electrode 89 on the planarized interlayer insulating layer 70.

A molding layer 90 and a photoresist pattern 93 are formed on the planarized interlayer insulating layer 70. The molding layer 90 is formed using an insulating layer having the same etching ratio as that of the planarized interlayer insulating layer 70. The photoresist pattern 93 has a hole overlying the node conductive layer pattern 78 and a portion of the lower electrode 89. Using the photoresist pattern 93 as an etch mask, an etch process 96 is performed on the molding layer 90.

Figure 9:
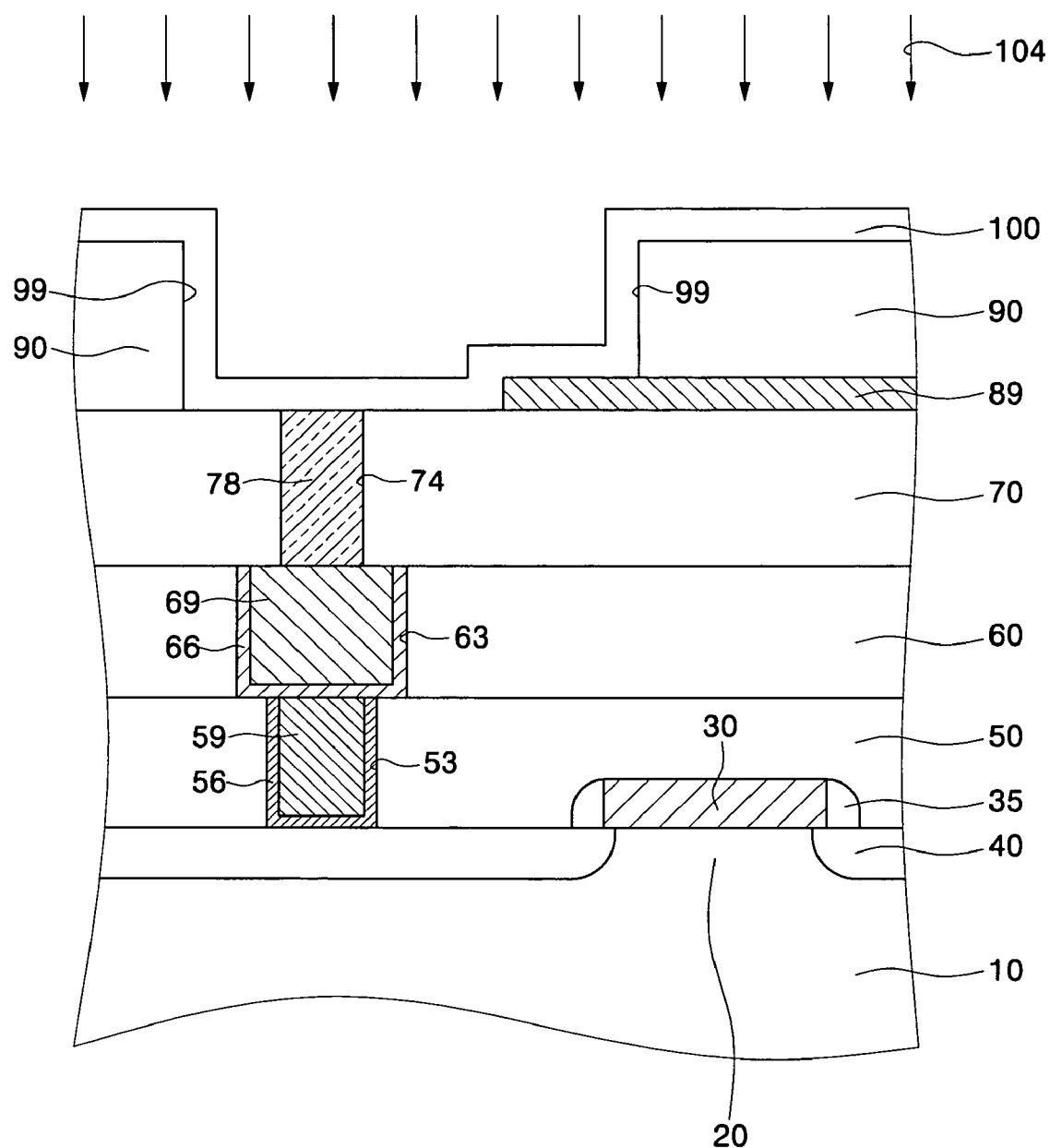
Figure 10:
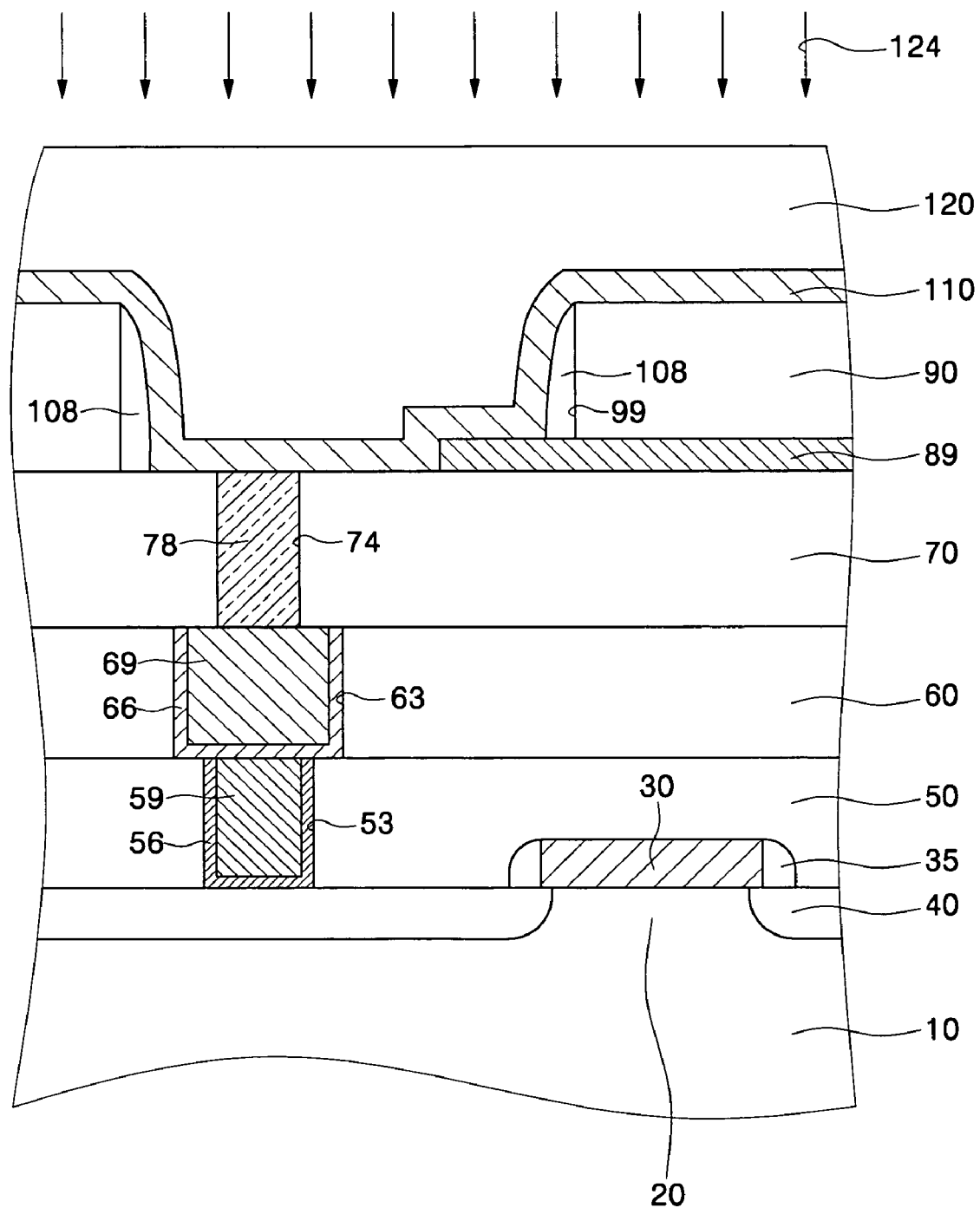

Referring to FIGS. 1, 9, and 10, after the performance of the etch process 96, the photoresist pattern 93 is removed from the semiconductor substrate 10. By the etch process 96, a pattern hole 99 is formed in the molding layer to expose the node conductive layer pattern 78 and a portion of the lower electrode 89. The width A1 of the pattern hole 99 at the node conductive layer pattern 78 may be greater than the width A2 at the lower electrode 89, as shown in FIG. 1.

A spacer layer 100 is formed on the molding layer 90 to conform to surfaces in the pattern hole 99. The spacer layer 100 may be formed from an insulating layer having the same etching ratio as that of the molding layer 90. The spacer layer 100 may be formed using an insulating layer having an etching ratio different from that of the molding layer 90. An etch process 104 is performed on the spacer layer 100 to expose an upper surface of the molding layer 90. Thus, spacers 108 are formed on sidewalls of the pattern hole 99. The spacers 108 control the size of a mold formed in the pattern hole 99. A phase-change layer 110 and a forming layer 120 are formed on the molding layer 90 to fill the mold in the pattern hole 99. The forming layer 120 may be formed using an insulating layer having the same etching ratio as that of the molding layer 90. Alternatively, the forming layer 120 may be formed using an insulating layer having an etching ratio different from that of the molding layer 90. The phase-change layer 110 may be formed using a chalcogenide material including a compound of germanium, antimony and tellurium ($Ge_xSb_yTe_z$). A planarization process 124 is performed on the forming layer 120 and the phase-change layer 110 to expose an upper surface of the molding layer 90.

Figure 11:
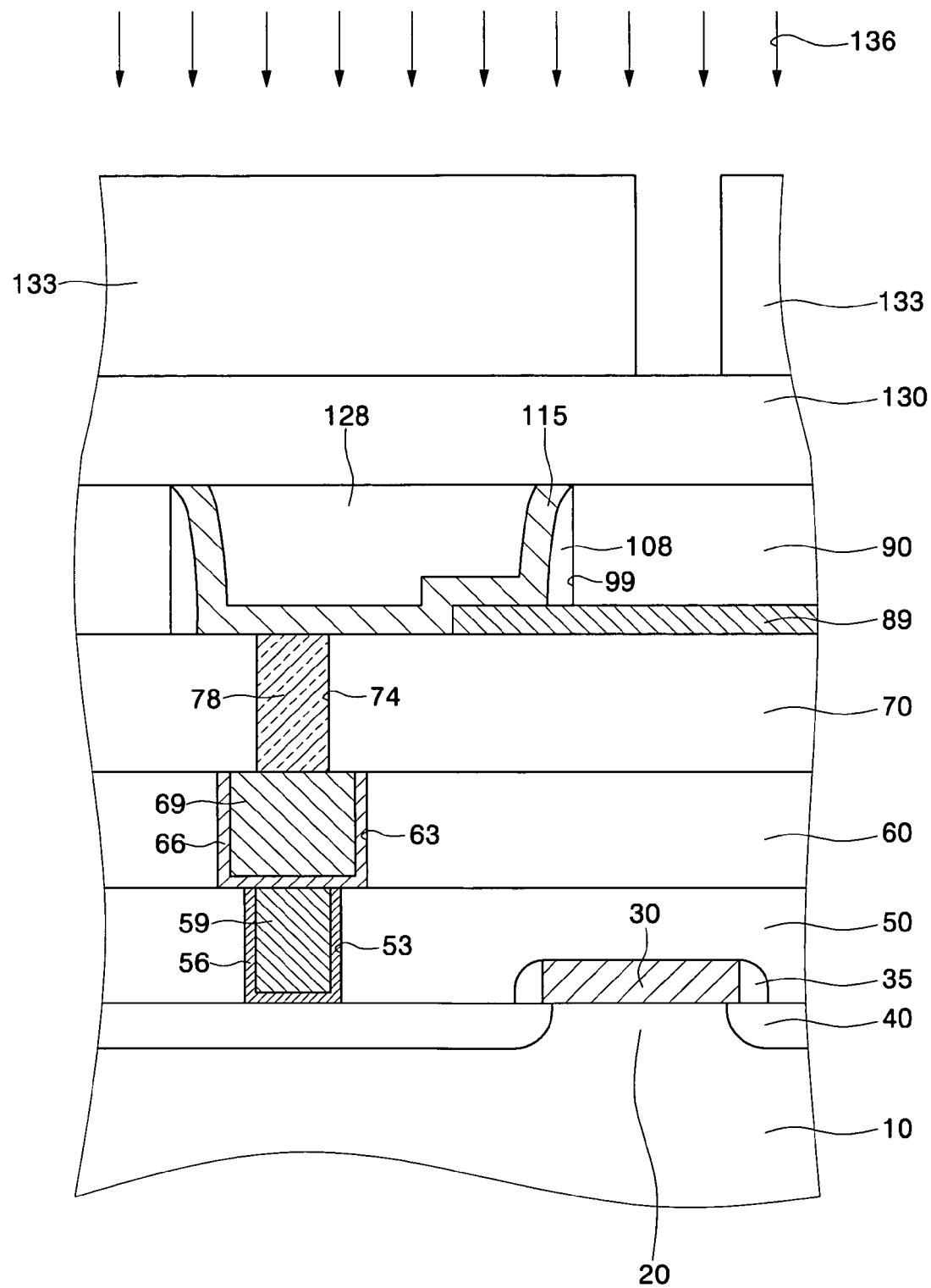
Figure 12:
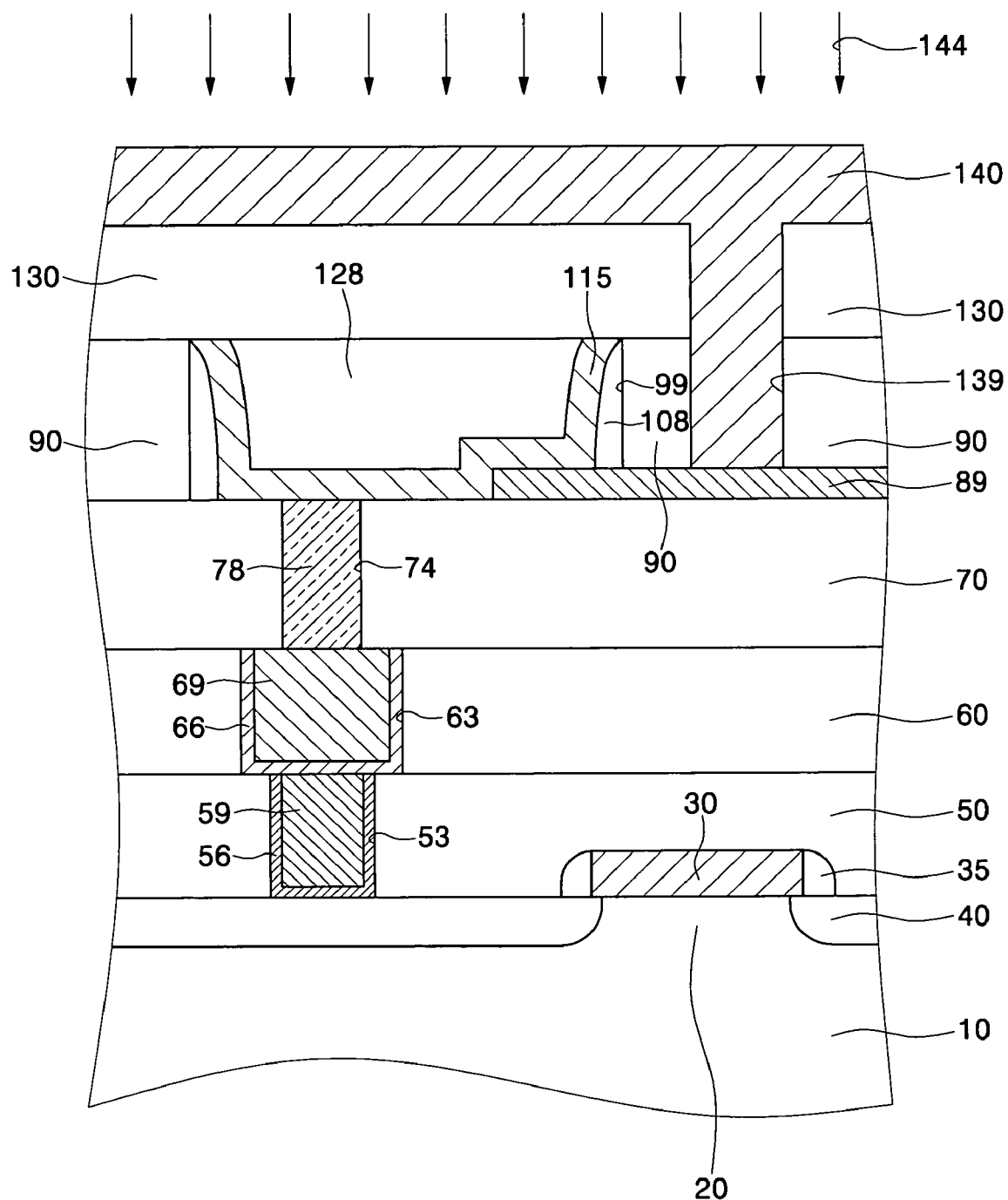
Figure 13:
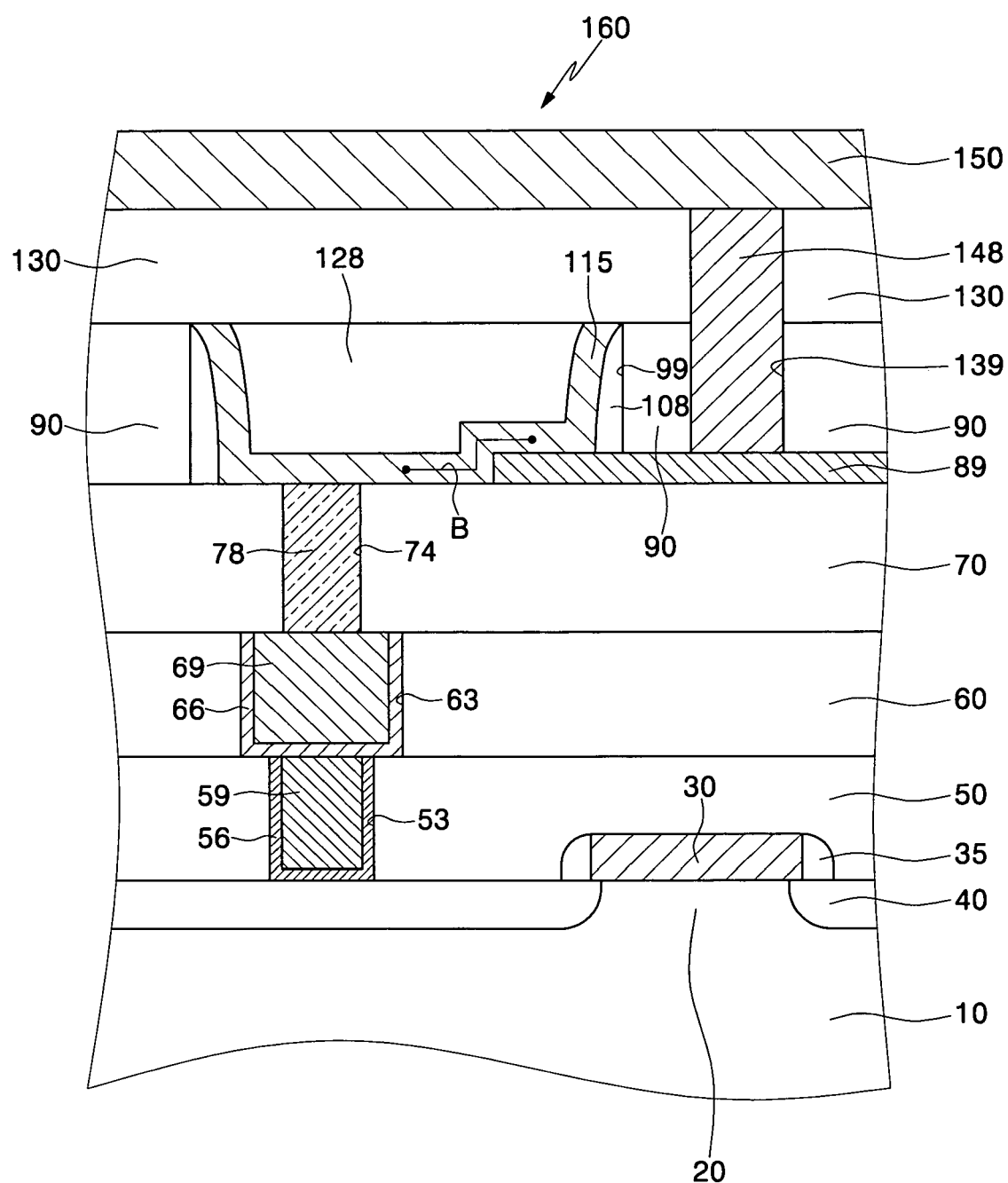

Referring to FIGS. 1, 11 and 13, the planarization process 124 forms a phase-change layer pattern 115 and a forming layer pattern 128 in the pattern hole 99. The upper surfaces of the forming layer pattern 128 and the molding layer 90 may be at substantially the same level. Alternatively, the upper surfaces of the forming layer pattern 128 and the molding layer 90 may have different levels. Further, top surfaces of the phase-change layer pattern 115 located on the node conductive layer pattern 78 and the lower electrode 89 have different widths in the direction perpendicular to the longitudinal direction of the phase-change layer pattern 115 (i.e., along the line I–I' of FIG. 1). The phase-change layer pattern 115 has a curved surface contacting the upper surface of the node conductive layer pattern 78. The distance between where the phase-change layer pattern 115 contacting the node conductive layer pattern 78 and the lower electrode 89 can be controlled using the spacer pattern 108, which can increase design freedom of the semiconductor fabrication processes sufficient to meet the reduction of the design rule of a semiconductor device.

A protecting layer 130 is formed on the molding layer 90 to cover the forming layer pattern 128 and the phase-change layer pattern 115. A photoresist pattern 133 is formed in a hole shape on the protecting layer 130. Using the photoresist pattern 133 as an etch mask, an etch process 136 is performed on the protecting layer 130 and the molding layer 90. After the performance of the etch process 136, the photoresist pattern 133 is removed from the semiconductor substrate 10. The etch process 136 forms a connection hole 139 penetrating the protecting layer 130 and the molding layer 90 to expose the lower electrode 89.

A connection node layer 140 is formed on the protecting layer 130 to fill the connection hole 139. The connection node layer 140 may be formed using a titanium nitride layer. A planarization process 144 is performed on the connection node layer 140 to expose the protecting layer 130. The planarization process 144 forms a connection node layer pattern 148 filling the connection hole 139. The connection node layer pattern 148 passes the protecting layer 130 and the molding layer 90 to contact the lower electrode 89. The connection node layer pattern 148 is substantially parallel with sidewall of the phase-change layer pattern 115. An upper electrode 150 is formed on the protecting layer 130 to contact the connection node layer pattern 148. The upper electrode 150 may be a titanium nitride layer, a titanium aluminum nitride layer, a tantalum nitride layer and/or a titanium tungsten layer. As a result, a PRAM (Phase-changeable memory device) 160 having the phase-change layer pattern 115 is formed on the semiconductor substrate 10. In the PRAM 160, the current consumed for the phase-change can be reduced since the area of the phase-change layer pattern 115 can be controlled by the pattern hole 99 and the spacer pattern 108.

Figure 14:
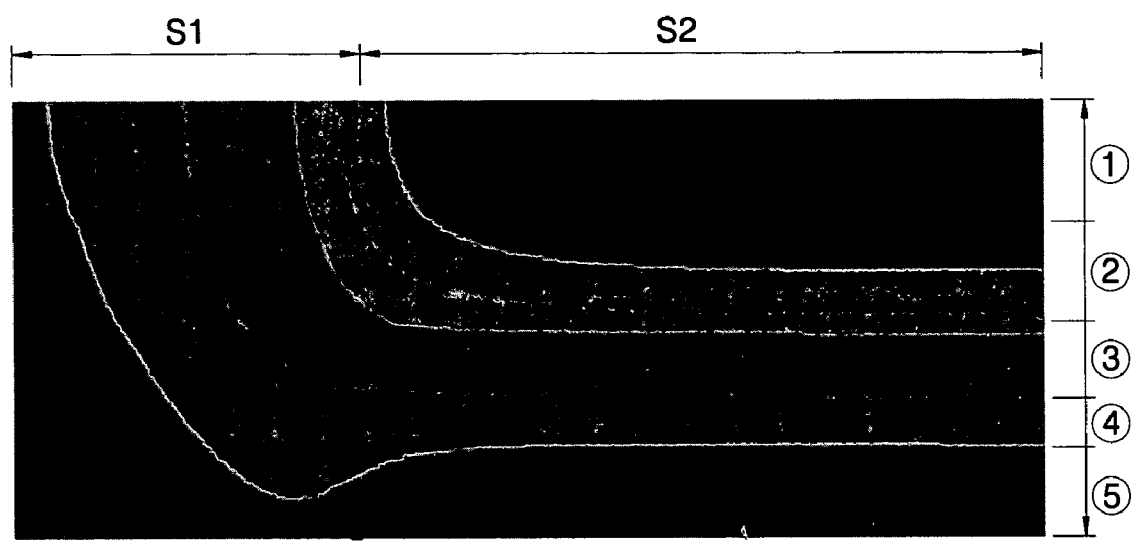
FIG. 14 is a simulation image illustrating a temperature distribution of a phase-change layer pattern during operation of a PRAM according to some embodiments of the present invention.

FIG. 14 is a simulation image illustrating a temperature distribution of a phase-change layer pattern during the operation of a PRAM according to some embodiments of the present invention.

Referring to FIGS. 1, 13 and 14, a temperature distribution of the phase-change layer pattern 115 while the PRAM 160 is driven will first be described. The top surfaces of the phase-change layer pattern 115 have different widths in the direction perpendicular to the longitudinal direction of the phase-change layer pattern 115 inside the pattern hole 99. The phase-change layer pattern 115 has symmetrical shapes on the right and left of a line B passing a center thereof as shown in FIG. 1. Thus, it is expected that the temperature distribution is symmetrical around the line B passing the center of the phase-change layer pattern 115 during the operation of the PRAM 160.

Taking the right or left of the phase-change layer pattern 115 around the line B, the phase-change layer pattern 115 has a temperature distribution as shown in FIG. 13 while the PRAM 160 is driven. The image of temperature distribution is illustrated using contour lines having temperature values on the phase-change layer pattern 115. In the image of the temperature distribution, a longitudinal axis indicates relative positions on the phase-change layer pattern 115, and a vertical axis has temperature values according to the relative positions. The temperature values are decreased by 250° C. as reference numbers (①, ②, ③, ④, ⑤) increase in order. The temperature value having the reference number "①" has an average temperature of 3200° C. The temperature value having the reference number "⑤" has an average temperature of 2200° C. Portions of the phase-change layer pattern 115 formed in the pattern hole 99 and having the predetermined width A1 of FIG. 1 are indicated by a reference number S1. Portions of the phase-change layer pattern 115 formed in the pattern hole 99 and having a predetermined width A2 of FIG. 1 are indicated by a reference number S2.

The phase-change layer pattern 115 shows a highest average temperature value at portions S2 in the pattern hole 99 while the PRAM is driven. Thus, it is shown that the PRAM 160 can reduce the size of a phase-change portion of the phase-change layer pattern 115 by using the pattern hole 99 having different widths A1, A2. Furthermore, the PRAM 160 can further reduce the size of phase-change region of the phase-change layer pattern 115 by using the spacer pattern 108 covering the sidewall of the pattern hole 99. This is because the phase-change layer pattern 115 can further increase in the case of using the inner resistance through the pattern hole 99 and the spacer pattern 108 rather than in the case of using the pattern hole 99 only. As a result, the portion of the phase-change region indicated by the reference number "①" can be moved the right on the image of the temperature distribution.

As described above, some embodiments of the present invention provide PRAMs having a phase-change layer pattern interposed between a molding layer and a forming layer pattern sufficient to meet the reduction of the design rule, and methods of forming the same. This can reduce the current consumption of the phase-change of the phase-change layer pattern by reducing the phase-change region.

Other embodiments of the present invention will now be described in a non-limiting way.

Embodiments of the present invention provide PRAMS having a phase-change layer pattern interposed between a molding layer and a forming layer pattern and methods of forming the same.

In some embodiments of the present invention, PRAMS can have a phase-change layer pattern interposed between a molding layer and a forming layer pattern that include a node conductive layer pattern disposed in a planarized interlayer insulating layer over a semiconductor substrate. A molding layer, a forming layer pattern and a protecting layer cover the planarized interlayer insulating layer and the node conductive layer pattern. The forming layer pattern is disposed and surrounded by the molding layer. A lower electrode is interposed between the molding layer and the planarized interlayer insulating layer. An upper electrode is disposed on the protecting layer. A phase-change layer pattern is disposed on the planarized interlayer insulating layer between the molding layer and the forming layer pattern. Also, the phase-change layer pattern contacts the node conductive layer pattern and a portion of the lower electrode. A spacer pattern is disposed between the phase-change layer pattern and the molding layer. Also, a connection node layer pattern passes in the protecting layer and the molding layer and is disposed on the lower electrode. The connection node layer pattern contacts the upper and lower electrodes. The lower electrode is disposed below the forming layer pattern and protrudes from the connection node layer pattern toward the node conductive layer pattern. Also, the phase-change layer pattern on the node conductive layer pattern and the phase change layer on the lower electrode respectively have different widths in the direction perpendicular to the longitudinal direction thereof.

According to some embodiments of the present invention, there are provided methods of forming the same that include forming a node conductive layer pattern in a planarized interlayer insulating layer over a semiconductor substrate. A lower electrode is formed on the planarized interlayer insulating layer. The lower electrode is spaced from the node conductive layer pattern with a predetermined distance. A molding layer on the planarized interlayer insulating layer covers the lower electrode. A pattern hole penetrates the molding layer, thereby exposing the node conductive layer pattern and a portion of the lower electrode. The spacer pattern is formed to cover the sidewall of the pattern hole. A phase-change layer and a forming layer are formed on the molding layer to fully fill the pattern hole. The forming layer and the phase-change layer are planarized to expose the molding layer, thereby forming a phase-change layer pattern and a forming layer pattern filling the pattern hole. A protecting layer on the molding layer is formed to cover the forming layer pattern and the phase-change layer pattern. A connection node layer pattern passes the protecting layer and the molding layer and contacts the lower electrode. An upper electrode is formed on the protecting layer to contact the connection node layer pattern. After processing, the width of the pattern hole surrounding the node conductive layer pattern is greater than a width of that exposing a portion of the lower electrode.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. An integrated circuit device comprising:
an interlayer insulating layer on a substrate;
a first electrode in the interlayer insulating layer;
a second electrode on or in the interlayer insulating layer and laterally displaced from the first electrode; and
a phase-change material layer pattern on the substrate, the phase-change material layer having a first portion in contact with the interlayer insulating layer and the first electrode and a second portion that extends laterally from the first portion to overlie and contact the second electrode, wherein the second portion extends from the first portion towards the second electrode along a first axis, and wherein the first portion has a greater width transverse to the first axis than the second portion.

2. An integrated circuit device comprising:
an interlayer insulating layer on a substrate;
a first electrode in the interlayer insulating layer;
a second electrode on or in the interlayer insulating layer and laterally displaced from the first electrode; and
a phase-change material layer pattern on the substrate, the phase-change material layer having a first portion in contact with the interlayer insulating layer and the first electrode and a second portion that extends laterally from the first portion to overlie and contact the second electrode, wherein the phase-change material layer pattern conforms to surfaces of a mold disposed on the interlayer insulating layer.

3. The device of claim 2, wherein the mold comprises:
a molding layer disposed on the interlayer insulating layer and having an opening therein;
a sidewall spacer disposed on a sidewall of the molding layer and on the second electrode; and
wherein the second portion of the phase-change material layer pattern extends between the first portion of the phase-change material layer pattern and the sidewall spacer.

4. An integrated circuit device comprising:
an interlayer insulating layer on a substrate;
a first electrode in the interlayer insulating layer;
a second electrode on or in the interlayer insulating layer and laterally displaced from the first electrode; and
a phase-change material layer pattern on the substrate, the phase-change material layer having a first portion in contact with the interlayer insulating layer and the first electrode and a second portion that extends laterally from the first portion to overlie and contact the second electrode, wherein the first portion of the phase-change material layer and the second electrode lie on the interlayer insulating layer, and
wherein the second portion steps up from the first portion to overlap the second electrode.

5. The device of claim 3, wherein a portion of the phase-change material layer on the second electrode abuts the sidewall spacer.

6. The device of claim 3, further comprising:
a connection node extending through the molding layer to contact the second electrode.

7. A method of forming an integrated circuit device comprising:
forming an interlayer insulating layer on a substrate;
forming a first electrode in the interlayer insulating layer;
forming a second electrode on or in the interlayer insulating layer and laterally displaced from the first electrode; and
forming a phase-change material layer pattern on the substrate, the phase-change material layer having a first portion in contact with the interlayer insulating layer and the first electrode and a second portion that extends laterally from the first portion to overlie and contact the second electrode, wherein the second portion extends from the first portion towards the second electrode along a first axis, and wherein the first portion has a greater width transverse to the first axis than the second portion.

8. A method of forming an integrated circuit device comprising:
forming an interlayer insulating layer on a substrate;
forming a first electrode in the interlayer insulating layer;
forming a second electrode on or in the interlayer insulating layer and laterally displaced from the first electrode; and
forming a phase-change material layer pattern on the substrate, the phase-change material layer having a first portion in contact with the interlayer insulating layer and the first electrode and a second portion that extends laterally from the first portion to overlie and contact the second electrode, wherein forming a phase-change layer comprises:
forming a mold on the interlayer insulating layer; and
forming the phase-change material layer pattern in the mold.

9. The method according to claim 8, wherein forming a mold comprises:
   forming a molding layer on the interlayer insulating layer and having an opening therein;
   forming a sidewall spacer on a sidewall of the molding layer and on the second electrode; and
   wherein the second portion of the phase-change material layer pattern extends between the first portion of the phase-change material layer pattern and the sidewall spacer.

10. A method of forming an integrated circuit device comprising:
   forming an interlayer insulating layer on a substrate;
   forming a first electrode in the interlayer insulating layer;
   forming a second electrode on or in the interlayer insulating layer and laterally displaced from the first electrode;
   forming a phase-change material layer pattern on the substrate, the phase-change material layer having a first portion in contact with the interlayer insulating layer and the first electrode and a second portion that extends laterally from the first portion to overlie and contact the second electrode;
   forming the first portion of the phase-change material layer and the second electrode to lie on the interlayer insulating layer; and
   forming the second portion to step up from the first portion to overlap the second electrode.

11. The method according to claim 9, further comprising:
   forming a portion of the phase-change material layer on the second electrode to abut the sidewall spacer.

12. The method according to claim 9, further comprising controlling the thickness of the sidewall spacer to control the overlap of the second portion of the phase-change material layer on the second electrode.

13. The method of claim 9, further comprising:
   forming a connection node extending through the molding layer to contact the second electrode.

* * * * *